(12) United States Patent
Takizawa

(10) Patent No.: US 7,031,892 B2
(45) Date of Patent: Apr. 18, 2006

(54) NUMERICAL-SIMULATION METHOD FOR ROTARY METAL FORMING, RECORDING MEDIUM AND PROGRAM

(75) Inventor: Hideo Takizawa, Saitama (JP)

(73) Assignee: Mitsubishi Materials Corporation, Tokyo (JP)

(*) Notice: Subject to any disclaimer, the term of this patent is extended or adjusted under 35 U.S.C. 154(b) by 823 days.

(21) Appl. No.: 09/927,517

(22) Filed: Aug. 13, 2001

(65) Prior Publication Data
US 2002/0045965 A1 Apr. 18, 2002

(30) Foreign Application Priority Data
Aug. 14, 2000 (JP) .............................. 2000-245983
Apr. 16, 2001 (JP) .............................. 2001-117156

(51) Int. Cl.
*G06F 17/10* (2006.01)
(52) U.S. Cl. .............................. 703/2; 700/175; 703/1; 703/6
(58) Field of Classification Search ............... 703/2, 703/6, 1; 700/175
See application file for complete search history.

(56) References Cited

U.S. PATENT DOCUMENTS 4,761,867 A * 8/1988 Vollmer et al. ............. 29/893.3
5,377,116 A * 12/1994 Wayne et al. ............... 700/175

FOREIGN PATENT DOCUMENTS

| JP | 6-168262 | 6/1994 |
| JP | 7-236923 | 9/1995 |
| JP | 9-185600 | 7/1997 |

OTHER PUBLICATIONS

Davey et al., "An efficient solution method for finite element ring-rolling simulation", International Journal for Numerical Methods in Engineering, vol. 47, Issue 12, Abstract.*
Davey et al., "An efficient solution method for finite element ring-rolling simulation", International Journal for Numerical Methods in Engineering, vol. 47, Issue 12, pp. 1997-2018.*
H. Takzawa, The Proceedings of the 51st Japanese Joint Conference for the Technology of Plasticity, pp. 283 and ii-xi, "Finite Element Analysis of Partially Modeled Ring Rolling" Nov. 3-5, 2000.

(Continued)

*Primary Examiner*—Kamini Shah
*Assistant Examiner*—Herng-der Day
(74) *Attorney, Agent, or Firm*—Oblon, Spivak, McClelland, Maier & Neustadt, P.C.

(57) ABSTRACT

Elongation in the circumferential direction of a rotary formed body is produced only within a model zone, and the approximate toric plate shape is maintained as the overall shape of the body, and the rotation axis of the body is positioned on a straight line connecting axes of rotation of a main roll and a mandrel roll. Moreover, the velocity of each nodal point and on imaginary cutting planes, that is a velocity boundary condition is expressed by a linear combination of coefficients comprising a radius of the imaginary cutting planes, and angles made by the imaginary cutting planes, with respect to three variables comprising an increasing rate of the radius of the body, an angular velocity for rotation about the rotation axis of the body, and a correction value for the traverse velocity of the rotation axis of the body.

16 Claims, 9 Drawing Sheets

OTHER PUBLICATIONS

H. Takzawa, et al., Proceeding of the 7th International Conference on Numerical Methods in Industrial Forming Processes—NUMIFORM 2001, Simulation of Materials Processing: Theory, Methods and Appliactions, pp. 601-606, "Rigid-Plastic Finite Element Analysis of Partially Modeled Ring Rolling", Jun. 18-20, 2001 (English document of reference AN).

M.Hayama, et al., Metal Forming, vol. 22, No. 240, pp. 71-79, "Estimation of Roll Force, Torque and Lateral Spread in Ring Rolling of Plain Ring", Jan. 1981(with English Abstract).

M. Hayama, Bulletin of the Faculty of Engineering, vol. 31, pp. 131-153, "Theoretical Analysis on Ring Rolling of Plain Ring", Mar. 1982 (English document of reference AP).

D. S. Wolf, The 23rd Forging Industry Technical Conference "2001—A Shape Odyssey", pp. 1-22, "Multi-Pass Ring Rolling Simulation", Apr. 23-25, 2001.

D. Y. Yang, et al., Int. J. Mech. Sci., vol. 33, No. 7, pp. 541-547 and 549-550, "Simulation of T-Section Profile Ring Rolling by the 3-D Rigid-Plastic Finite Element Method", 1991.

D. Y. Yang, et al., Int. J. Mech. Sci., vol. 30, No. 8, pp. 571-580, "Rigid-Plastic Finite Element Analysis of Plane Strain Ring Rolling", 1998.

N. Kim, et al., Int. J. Mach. Tools Manufact., vol. 30, No. 4, pp. 569-577, "Ring Rolling Process Simulation by the Three Dimensional Finite Element Method", 1990.

Frank Heislitz, et al., "Simulation of Roll Forming Process with the 3-D FEM Code PAM-STAMP", Journal of Materials Processing Technology, vol. 59, No. 1-2, XP-002297364, May 15, 1996, pp. 59-67.

S. G. Xu, et al., "Simulation of Ring Rolling Using a Rigid-Plastic Finite Element Model", International Journal of Mechanical Sciences, vol. 33, No. 5, XP-008035300, 1991, pp. 393-401.

M. Abo-Elkhier, "Elasto-Plastic Finite Element Modeling of Strip Cold Rolling Using Eulerian Fixed Mesh Technique", Finite Elements in Analysis and Design, vol. 27, No. 4, XP-002297365, Nov. 15, 1997, pp. 323-334.

* cited by examiner

Reduction:0%  $\delta_x$/MPa

Reduction:0%  $\delta_x$/MPa

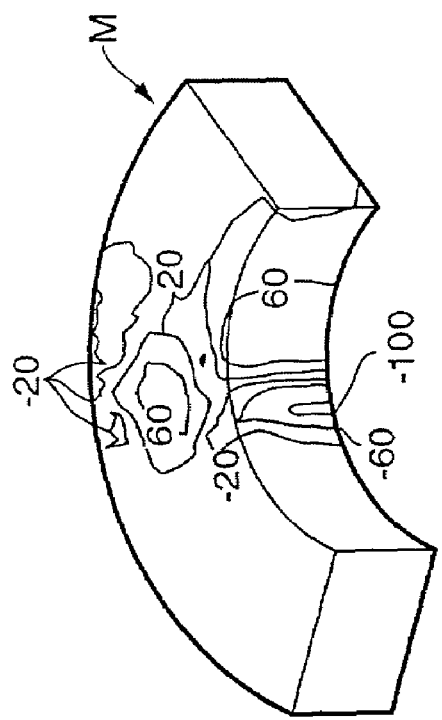
FIG. 8A Reduction:15% $\delta_x$/MPa
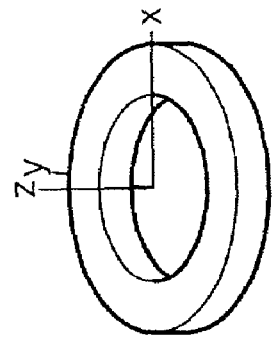
FIG. 8C
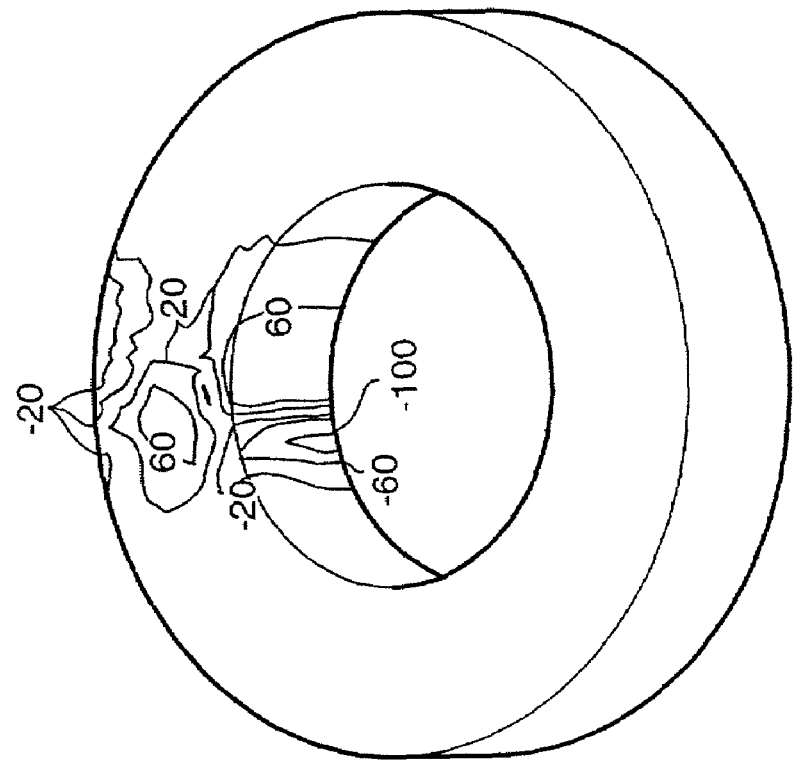
FIG. 8B Reduction:15% $\delta_x$/MPa Reduction:40%  $\delta_x$/MPa Reduction:40%  $\delta_x$/MPa

NUMERICAL-SIMULATION METHOD FOR ROTARY METAL FORMING, RECORDING MEDIUM AND PROGRAM

BACKGROUND OF THE INVENTION

1. Field of the Invention

The present invention relates to a method for analyzing on a computer, the plastic deformation process of a rotary formed body in rotary metal forming such as disk rolling, spinning, curling and rotary forging, as in for example the metal forming of a formed and fabricated materials having a ring shape in ring rolling. In particular, the invention relates to a technique for performing numerical simulation by modeling a rotary formed body using a rigid plastic finite element analysis method.

2. Description of the Related Art

Heretofore, with a background of increased speed in computer processing and advancement in finite element analysis methods, improvements in efficiency of process design is advancing due to performing virtual numerical simulation by computer before performing actual trials of metal working processes.

However, with respect to the processing methods for plastic deformation by repeating localized contact with a rotary formed body, such as for example in the ring rolling process for performing metal forming of a formed and fabricated materials having a ring shape, multiple contact and withdrawal of the forming roll and the rotary formed body is repeated from the start of forming to completion of forming. Therefore there are cases where in numerical simulation using the finite element analysis method, considerable computation time is necessary.

For example, in the rigid plastic finite element analysis method, in a method for modeling the entire rotary formed body of a ring shape or the like, and moreover in a method for providing relatively fine finite elements in a predetermined zone inside the roll gap, as well as modeling the entire body (for example, N. S. KIM, S. MACHIDA and S. KOBAYASHI, Ring Rolling Process Simulation by the Three Dimensional Finite Element Method. Int. J. Mach. Tools Manufact. 30, 569 (1990)), it is possible to reproduce highly accurately the complex plastic deformation in three dimensions of the rotary formed body. However, since the numerical simulation is also executed for the zone outside of the roll gap interior which has only been slightly deformed, there is the problem that considerable computation time is necessary.

On the other hand, for example as with a two-dimensional cross-section approximation, essentially it is possible to considerably shorten the computation time with a method which handles the plastic deformation process in three dimensions with a two dimensional and an expanded two dimensional model. However, because there are many assumptions related to transformations for making this applicable when two dimensionalized, the accuracy with respect to the analysis of the complex shape is low, and the influence of for example the roll diameter of the forming roll and the ring radius of the rotary formed body can not be taken into consideration. Hence a problem arises in that the accuracy of the plastic strain obtained as the result of the analysis is low.

Therefore, there is known a numerical-simulation method using a partial model for modeling by finite elements which subdivide only a predetermined zone for producing the main plastic deformation such as inside of the roll gap in the ring rolling (for example, D. Y. YANG, and K. H. KIM, Rigid-Plastic Finite Element Analysis of Plane Strain Ring Rolling. Int. J. Mech. Sci. 30, 571 (1988) and D. Y. YANG, K. H. KIM and J. B. HAWKYARD, Simulation of T-Section Profile Ring Rolling by the 3-D Rigid-Plastic Finite Element Method. Int. J. Mech, Sci. 33, 541 (1991)).

Incidentally, in the numerical-simulation method using the above-mentioned partial model, it is possible to shorten the computation time, and to reproduce highly accurately complex plastic deformation in three dimensions. However, if the velocity boundary conditions at the boundary (imaginary cutting plane) of the zone that has been modeled and the zone that has not been modeled are not appropriately set, a problem arises in that high accuracy analysis results can not be obtained.

For example, in the numerical-simulation method according to the above-mentioned related art, the velocity boundary conditions are only set based on the assumption that the boundary cross-sections set in the rotary formed body have rigid body rotation in respective independent peripheral directions (circumferential directions) in only two cutting planes. Hence a problem arises in that, for the plastic deformation produced at the time of the forming process, it is not possible to reproduce for example the plastic deformation for where the rotary formed body is rolled out in the roll gap and elongates in the circumferential direction.

Moreover, in the numerical-simulation method according to the above mentioned related art, since the ring rolling process being essentially a transient deformation process, is handled as divided steady deformation, the entire process can not be reproduced as a continuous phenomena. Hence a problem arises in that the accuracy of the simulation can not be improved.

DISCLOSURE OF THE INVENTION

The present invention takes into consideration the above mentioned situation with the object of providing a numerical-simulation method for rotary metal forming where the accuracy of the numerical simulation can be improved without lengthening the computation time necessary, when at the time of performing numerical simulation by a computer for the plastic deformation of a rotary formed body at the time of a forming process by for example ring rolling, the boundary conditions are set based on the elongation deformation produced in a circumferential direction of the rotary formed body in boundary cross-sections set in the rotary formed body, that is, in imaginary cutting planes set for a partial model. Moreover an object is to provide a program for realizing on a computer this numerical-simulation method for rotary metal forming, and a computer readable recording medium recorded with this program.

In order to achieve such an object of solving the above problems, the present invention: divides into a plurality of finite elements a predetermined model zone between two imaginary cutting planes intersecting with a circumferential direction in a rotary formed body rotated about an axis of rotation; expresses velocity boundary conditions of the imaginary cutting planes for the model zone by a function where angular velocity for rotation about the axis of rotation of the rotary body is made a variable; and analyses by a finite element method a forming process which continuously produces plastic deformation by localized contact with the rotary formed body.

According to the above, with respect to transient deformation (that is, the deformation where the strain rate and the deformation stress change with time) where the diameter of the rotary formed body is increased without the axis of rotation of the rotary formed body being displaced, as in, for example disk rolling, cylindrical and conical spinning, disk edge curling and rotary forging, at first only the partial zone producing the main plastic deformation is divided into finite elements.

Then, the velocity boundary conditions are set assuming that elongation in the peripheral direction (for example the circumferential direction) of the rotary formed body is produced only inside the model zone, and the entire shape of the rotary formed body existing in the non-model zone which is continuous with the model zone maintains an approximately circular shape. Accordingly, the velocity boundary condition can be expressed by a function where the angular velocity for rotation about the axis of rotation of the rotary formed body is a variable. Hence, in comparison for example to the method for modeling and analyzing the entire rotary formed body, the computation time necessary can be considerably reduced without degrading the accuracy of the numerical simulation. Accordingly, it is possible to contribute to efficiency improvement of the process design of the metal working process, and it is possible to lower the number of trials in the actual metal working and to improve the stability of the quality of the product due to the metal working.

In addition, in the present invention, in the case where the axis of rotation is displaced with addition of an increase in diameter of the rotary formed body in the forming process, the velocity boundary conditions are expressed by a function having three variables comprising; an increasing rate of the diameter of the rotary formed body, the angular velocity for rotation about the axis of rotation of the rotary formed body, and a correction value for traverse velocity of the axis of rotation.

According to the above, in the case of a transient deformation where the diameter of the rotary formed body is increased and also the axis of rotation of the rotary formed body is displaced, as in, for example ring rolling, the velocity boundary conditions are set assuming that elongation in the peripheral direction (for example the circumferential direction) of the rotary formed body is produced only inside the model zone, the entire shape of the rotary formed body existing in the non-model zone which is continuous with the model zone maintains an approximately circular shape, and the axis of rotation O of the rotary formed body is displaced for example in ring rolling, on a straight line connecting the axis of rotation of the main roll and the axis of rotation of the mandrel roll.

Accordingly, the velocity boundary conditions can be expressed by a function having three variables comprising; the angular velocity for rotation about the axis of rotation of the rotary formed body, the increasing rate of the diameter of the rotary formed body and the correction value for traverse velocity of the axis of rotation. Hence, in comparison for example to the method for modeling and analyzing the entire rotary formed body, the computation time necessary can be considerably reduced without degrading the accuracy of the numerical simulation. Accordingly, it is possible to contribute to efficiency improvement of the process design of the metal working process, and it is possible to lower the number of trials in the actual metal working, and the stability of the quality of the product due to the metal working can be improved.

Moreover, in the present invention, the velocity boundary conditions may be expressed by a function having other variables capable of conversion into the aforementioned variables.

According to the above, by for example changing the coordinate system, the angular velocity of the rotary formed body, the correction value for the traverse velocity of the axis of rotation and the increasing rate of the diameter of the rotary formed body can be converted to other variables.

For example, in place of the increasing rate of the radius, the velocity boundary conditions can be expressed with the increasing rate of the angle with respect to the circumferential direction of the model zone which can be converted from the increasing rate of the radius, as a variable.

In addition, for example in place of the increasing rate of the radius and the angular velocity of the rotary formed body, the velocity boundary condition can be expressed with the angular velocity of the two imaginary cutting planes being the boundary cross-sections of the model zone and the non-model zone which can be converted from the increasing rate of the radius and the angular velocity of the rotary formed body, as variables. Consequently, as well as being able to increase the degree of freedom of the numerical simulation, it is possible to improve the generality of the numerical simulation. In addition to this, it is possible to increase the degree of freedom of the programming, and improve the generality of the program.

Moreover, in the present invention, a Euler method where the finite elements are spatially fixed is applied with respect to the rotation direction of the rotary formed body, and a Lagrange method where the finite elements are movable with the rotary formed body is applied with respect to a direction along the axis of rotation of the rotary formed body and the radial direction of the rotary formed body.

According to the above, with respect to the rotation direction of the rotary formed body, by applying the Euler method which performs integration with respect to the variables such as the cross-section shape and the strain without moving the finite elements of the circumferential direction, and with respect to a direction along the axis of rotation of the rotary formed body and the radial direction of the rotary formed body, applying the Lagrange method where the finite elements are moved with deformation of the rotary formed body, it is possible to follow the shape change and strain in the radial direction and the direction of the rotation axis with high accuracy, without altering the position of the nodal points dividing the finite elements of the circumferential direction.

Furthermore, the present invention, this may involve; dividing a non-model zone outside of the model zone of the rotary body by elements for data storage, and of the two imaginary cutting planes, sequentially storing data related to the velocity boundary conditions output from one of the imaginary cutting planes in the elements and inputting from an other of the imaginary cutting planes, or computing the data for the non-model zone using interpolation related to the angle about the axis of rotation, based on the data at the one of the imaginary cutting planes and the data at the other of the imaginary cutting planes, and inputting from the other of the imaginary cutting planes.

According to the above, the boundary cross-section of the model zone and the non-model zone in the circumferential direction, that is, information such as the shape and strain output from one of the imaginary cutting planes is input again to the model zone from the other of the imaginary cutting planes after a predetermined time delay, and by so doing the shape and strain of the model zone is updated.

In this case, a Euler mesh for data retention for storing the information output from the model zone may be prepared in the non-model zone, and in the case where changes such as the deformation and strain in the non-model zone are smooth, this may be interpolated by a function such as for example a linear approximation. Whichever method is used, the accuracy when time integrating the calculated velocity field can be improved, and the numerical simulation can be executed with high accuracy and high speed.

BRIEF DESCRIPTION OF THE DRAWINGS

FIG. 8A is a diagram showing the calculation results of the stress distribution in the case where the reduction in the radial direction of the rotary formed body is 15%, being a diagram showing the result for an example according to the partial model of the rotary formed body 31.

FIG. 8B is a diagram showing the calculation results of the stress distribution in the case where the reduction in the radial direction of the rotary formed body is 15%, being a diagram showing the results or a comparative example where the entire rotary formed body 31 is modeled and analyzed.

FIG. 8C is a diagram showing a coordinate system employed in FIGS. 8A and 8B.

DETAILED DESCRIPTION OF THE PREFERRED EMBODIMENTS

Hereunder is a description of a numerical-simulation method for rotary metal forming according to an embodiment of the present invention, with reference to the accompanying drawings.

Figure 1:
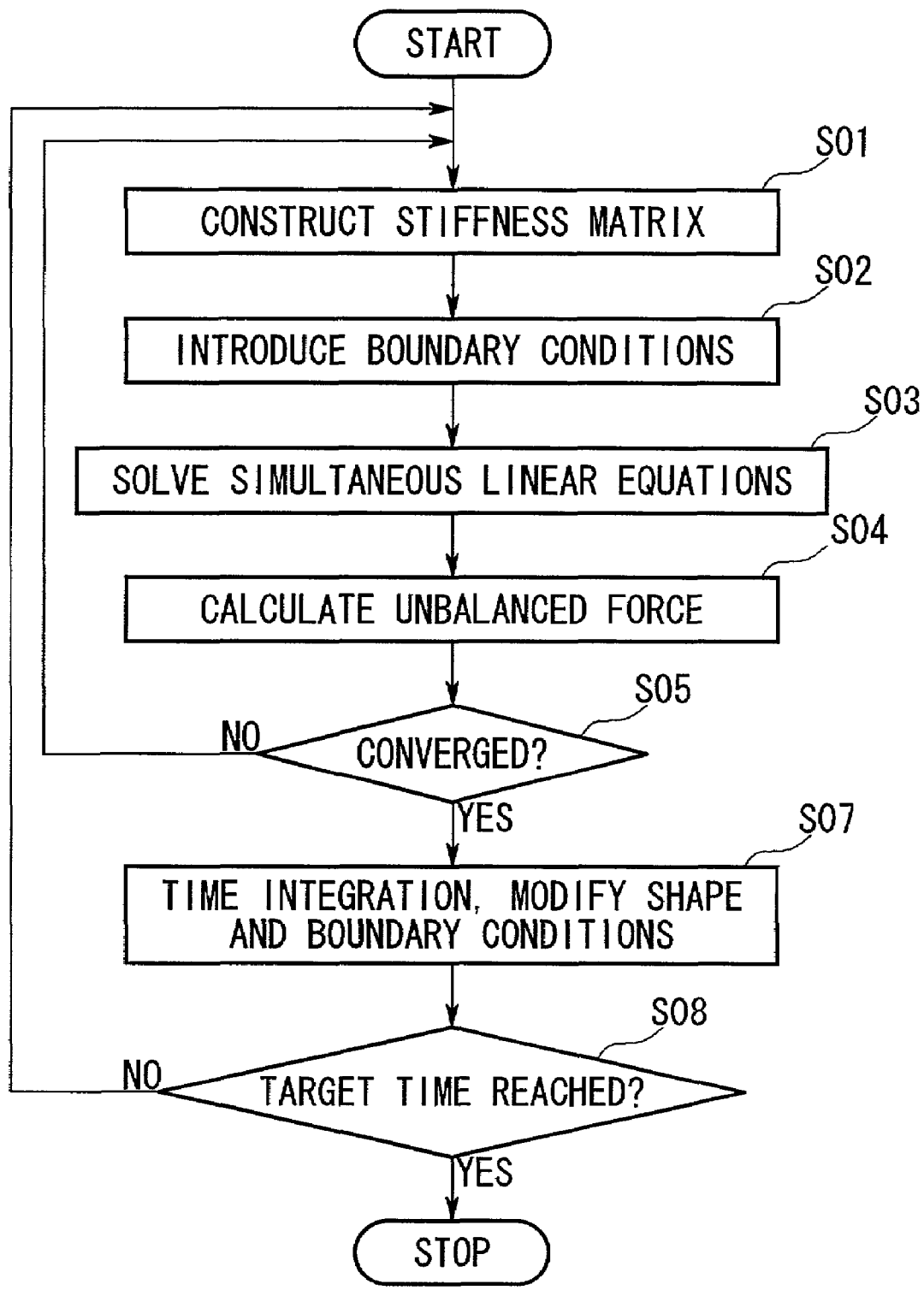
FIG. 1 is a flow chart illustrating a numerical-simulation method for rotary metal forming according to a first embodiment of the present invention.
Figure 2:
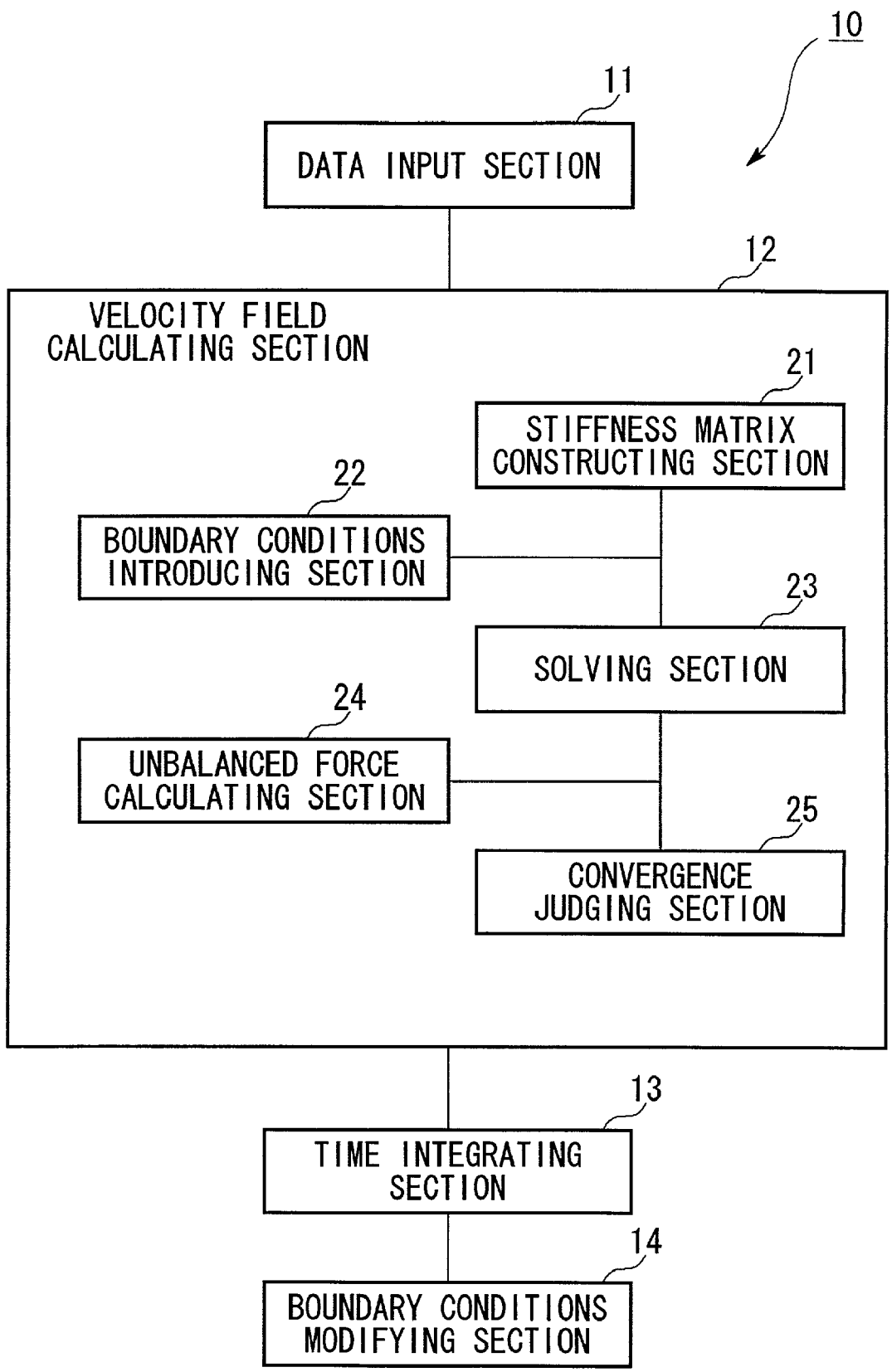
FIG. 2 is a block diagram showing a structure of a simulation apparatus for realizing the numerical-simulation method for rotary metal forming shown in FIG. 1.
Figure 3:
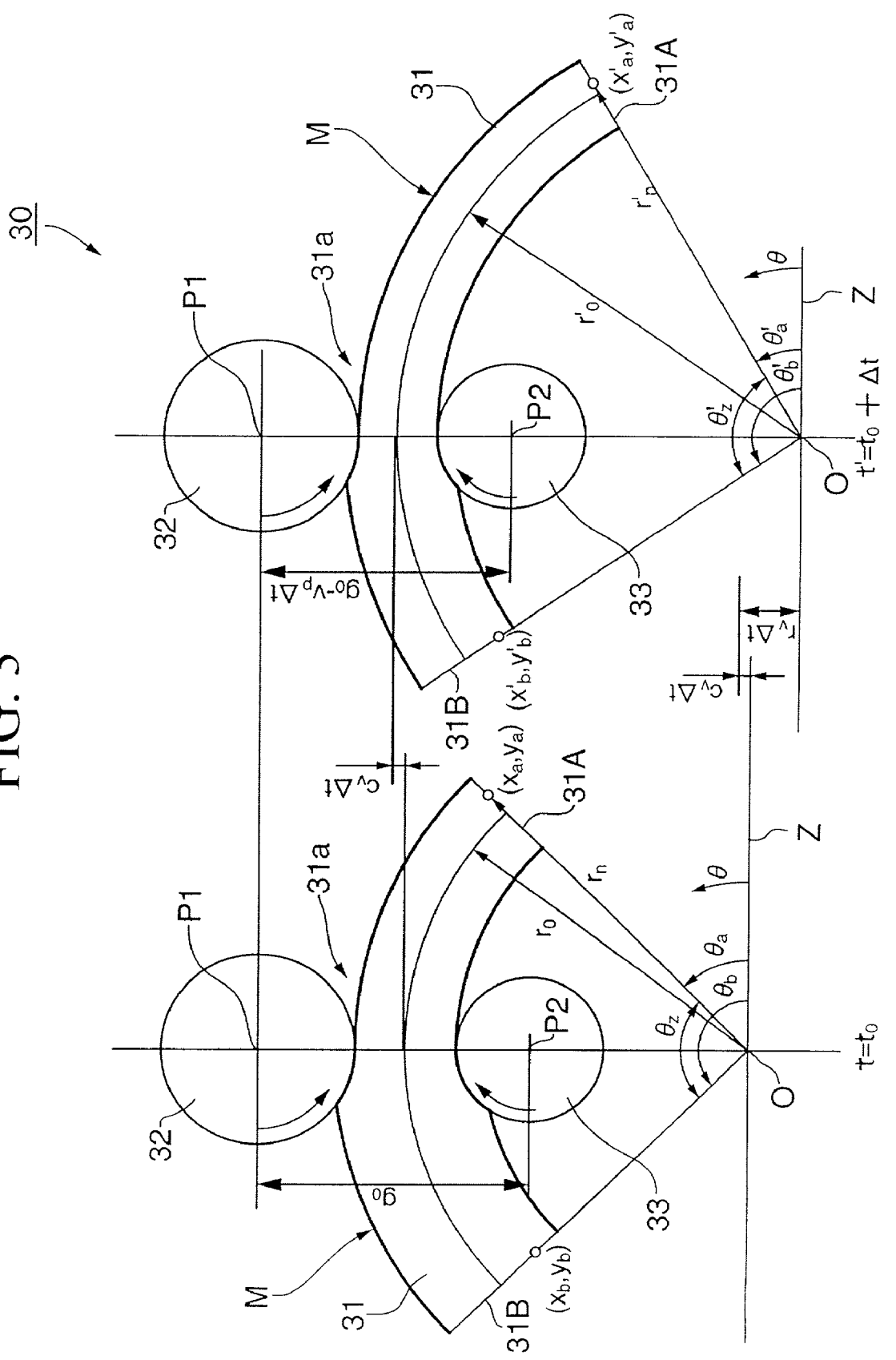
FIG. 3 is a diagram showing a plastic deformation process of a rotary formed body in ring rolling.
Figure 4:
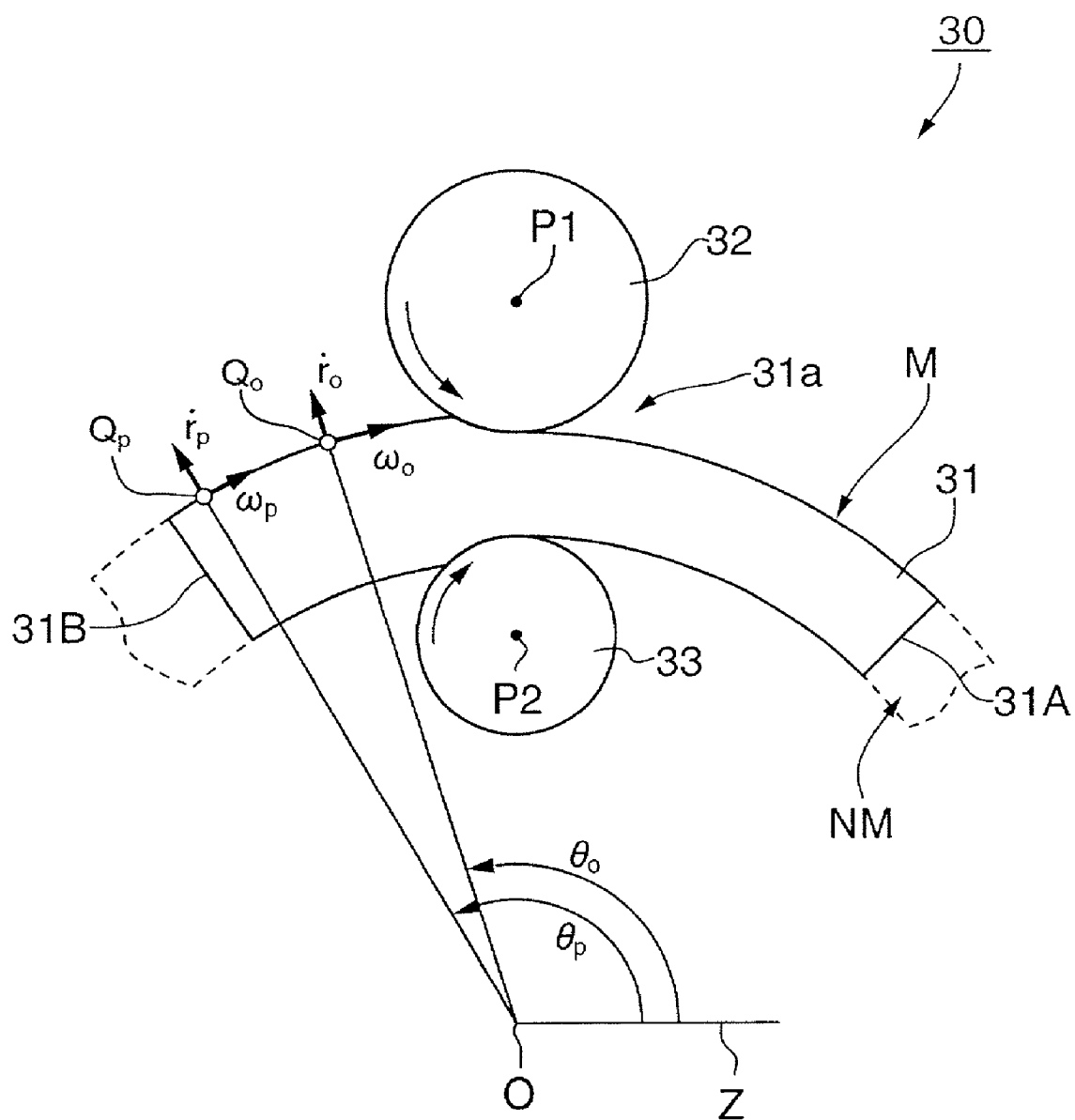
FIG. 4 is a diagram showing the coordinates of nodal points for a case where time integration in the radial direction is performed with respect to a calculated velocity field.
Figure 5A:
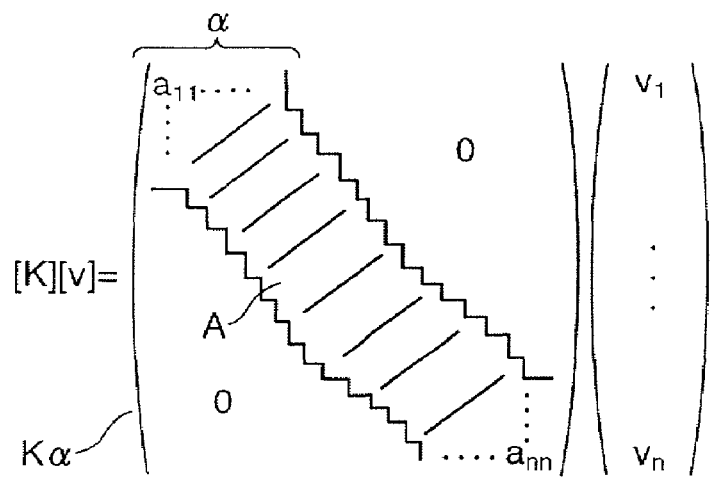
FIG. 5A is a diagram showing a stiffness matrix K obtained by introducing velocity boundary conditions.
Figure 5B:
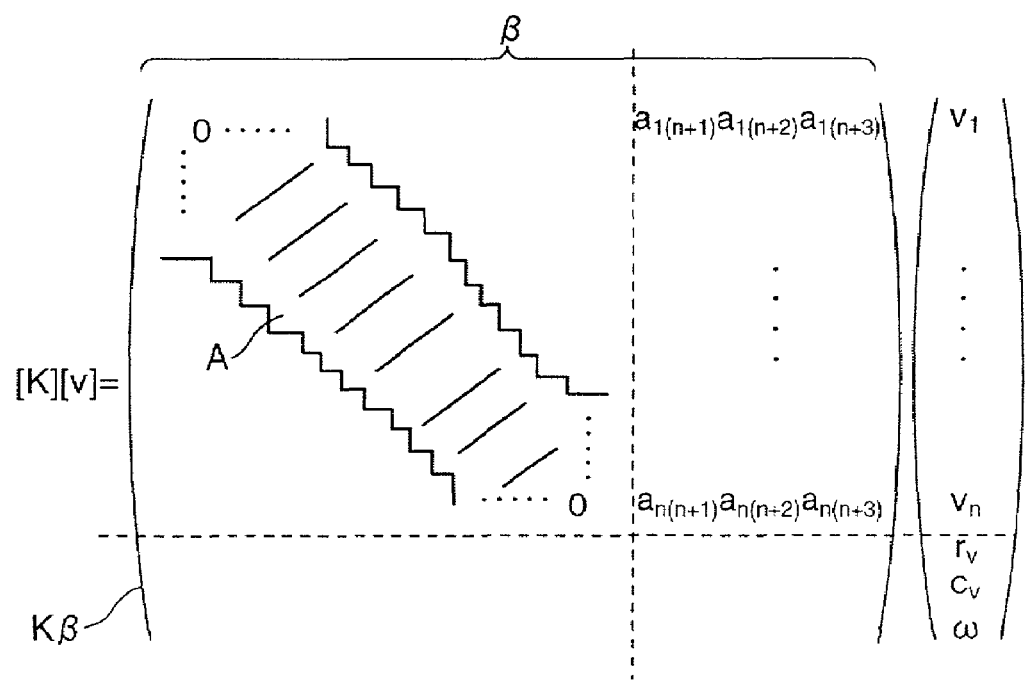
FIG. 5B is a diagram showing the stiffness matrix K obtained by expanding for three variables.
Figure 6:
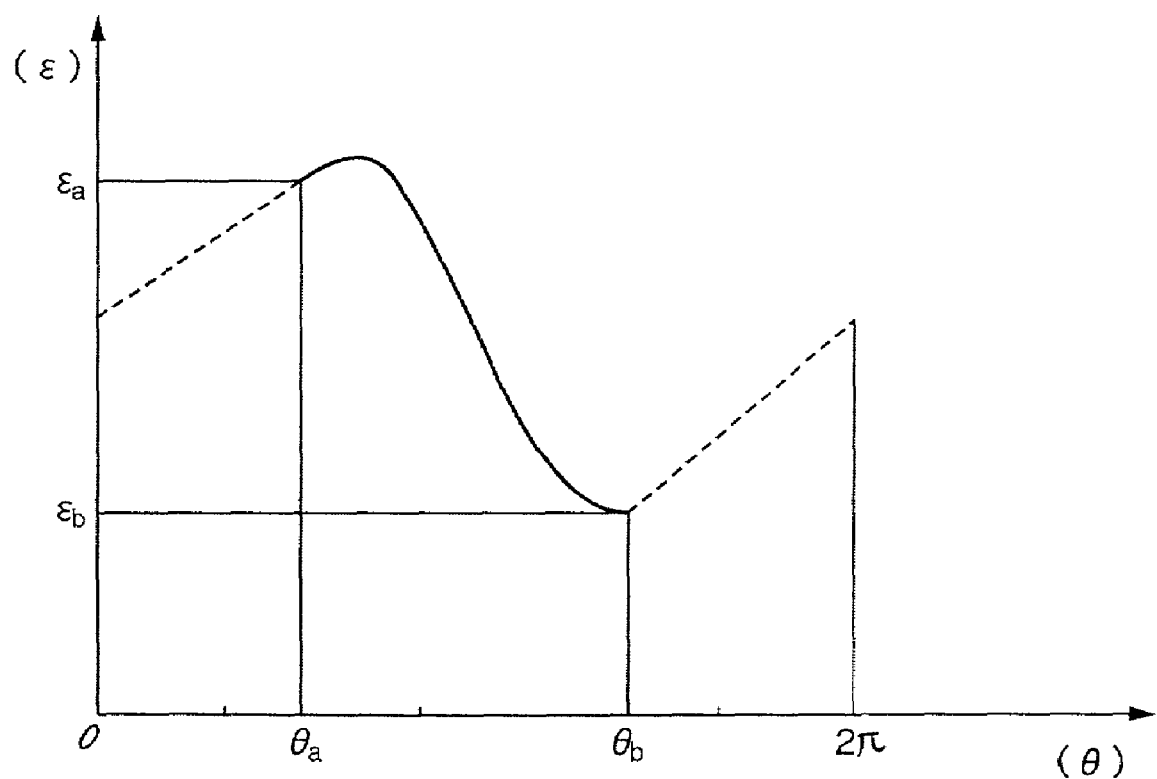
FIG. 6 is a graph showing interpolation of data in a non-model zone NM.

FIG. 1 is a flow chart illustrating a numerical-simulation method for rotary metal forming according to an embodiment of the present invention. FIG. 2 is a block diagram showing the structure of a simulation apparatus 10 for realizing the numerical-simulation method for rotary metal forming shown in FIG. 1. FIG. 3 is a diagram showing a plastic deformation process of a rotary formed body 31 in ring rolling. FIG. 4 is a diagram showing the coordinates of nodal points for a case where time integration in the radial direction is performed with respect to a calculated velocity field. FIG. 5A is a diagram showing a stiffness matrix K obtained by introducing velocity boundary conditions. FIG. 5B is a diagram showing the stiffness matrix K obtained by expanding for three variables. FIG. 6 is a graph showing the interpolation of data in a non-model zone NM.

The simulation apparatus 10 for realizing the numerical-simulation method for rotary metal forming according to the embodiment of the present invention, as shown for example in FIG. 2, comprises; a data input section 11, a velocity field calculation section 12, a time integrating section 13, and a boundary condition modifying section 14. Moreover, the velocity field calculation section 12 comprises; a stiffness matrix constructing section 21, a boundary condition introducing section 22, a solving section 23, an unbalanced force calculating section 24 and a convergence judging section 25.

The data input section 11, as mentioned below, inputs information necessary for the calculation of the velocity field in the model zone of the rotary formed body, such as information on reduction, deformation resistance, and so forth. The velocity field calculation section 12 calculates the velocity field with respect to, for example, the deformation velocity and strain rate. The time integrating section 13 calculates the deformation and strain in the model zone of the rotary formed body according to the calculated velocity field.

Here, in the velocity field calculation section 12, the stiffness matrix constructing section 21 constructs a stiffness matrix based on the information on the deformation resistance, with respect to each nodal point set by the partial model of the rotary formed body.

The boundary condition introducing section 22 sets the velocity boundary conditions (for example the displacement fixing) for the boundary cross-section of the modeled zone and the non-modeled zone of the rotary formed body, that is, the imaginary cutting plane. For example, in the case of deformation analysis, it sets a zero in the information for the degree of freedom of the nodal points that are not displaced in the stiffness matrix.

Moreover, the boundary condition introducing section 22 is represented by three variables, namely: an increasing rate for the radius of the rotary formed body, a correction value corresponding to the traverse velocity of the axis of rotation of the rotary formed body, and an angular velocity corresponding to rotation about the axis of rotation of the rotary formed body, or a linear combination of other variables which can be converted to these variables.

The solving section 23 solves linear simultaneous equations for stiffness matrices with intrinsic velocity boundary conditions, by for example the Cholesky's factorization method.

The unbalanced force calculating section 24, as mentioned below, calculates the unbalanced force based on the equation for equilibrium of the force of the nodal points derived for example from the principle of virtual work.

The convergence judging section 25 performs convergence judging of the unbalanced force, and outputs the judgment result to the time integrating section 13. Then, when the unbalanced force is judged to be converged, the deformation velocity and the strain rate for example are calculated by time integration from the velocity vector, in the time integrating section 13.

Then, the boundary condition modifying section 14 alters the velocity boundary conditions according to the calculated velocity vector. For example, in the deformation analysis, the shape of the modeled zone of the rotary formed body is changed, and for example the forming roll and the rotary formed body are separated at a contacting position, and the coefficients for constructing the stiffness matrix are changed by newly contacting the forming roll and the rotary formed body.

Hereunder, is a description with reference to the figures, of the numerical-simulation method for rotary metal forming according to the present embodiment, for example the case where the ring rolling process is numerically simulated.

Here, the ring rolling process is a process for producing a toric rotary formed body 31 (refer FIG. 3) by metal forming. For example, as illustrated in FIG. 3 and FIG. 4, a ring-rolling mill 30 according to the present embodiment comprises a main roll 32 capable of rotation drive abutted against an outer peripheral surface of the approximate toric plate rotary formed body 31 and a rotatable mandrel roll 33 having a diameter smaller thank for example, the main roll 32, abutted against an inner peripheral surface of the rotary formed body 31.

Here, the rotary formed body 31 is arranged so that the thick section in the radial direction has on either side, the main roll 32 on the outer peripheral side and the mandrel roll 33 on the inner peripheral side. Then, by rotationally driving the main roll 32, the rotary formed body 31 is caused to rotate, and by adjacently moving the mandrel roll 32 towards the main roll 32 so that the mandrel roll 33 approaches the main roll 32, the thick section in the radial direction of the rotary formed body 31 is continuously rolled.

Accordingly, the rotary formed body 31 is such that the thickness in the radial direction is made thinner while maintaining the approximate toric plate shape, and the diameter is successively expanded.

Next is a description with reference to the accompanying drawings, of a numerical-simulation method using the finite element method for the above mentioned ring rolling process.

First, in step S01 shown in FIG. 1, a stiffness matrix K is generated, based on input data of for example, the reduction and rotation velocity of the main roll 32, the traverse velocity of the mandrel roll 33 and the deformation resistance of the rotary formed body 31.

Here, in the rotary formed body 31, because a relatively large plastic deformation is produced in the vicinity of the roll gap 31a between both rolls 32 and 33, and a relatively small plastic deformation is produced in the zone outside of the vicinity of this roll gap 31a, partial modeling is performed by limiting the section for division into a plurality of finite elements for analysis to a predetermined model zone M in the vicinity of the roll gap 31a.

Then, the stiffness matrix K related to information such as the deformation resistance for example, is generated for the nodal points of each finite element. That is, the stiffness matrix K is used for calculating the velocity vector corresponding to the deformation velocity and strain rate of each nodal point. For example, the strain rate indicates at what degree of velocity the model zone M is distorted, and the deformation resistance in this case corresponds to the resistance produced when strain occurs in the model zone M.

Next, in step S02, as shown in for example the following equation (1), the velocity boundary condition (for example the displacement fixing) is introduced to the equation of the system set based on the stiffness matrix K. Moreover, in the equation (1), [v] denotes the velocity vector corresponding to the deformation velocity and strain rate at each nodal point, and [F] denotes the force vector.

Then, as mentioned above, the stiffness matrix K does not include information related to for example the constraint condition of each nodal point, but is comprised of information related to what degree of deformation resistance each nodal point has.

$$[K][v]=[F] \quad (1)$$

Here, as mentioned below, the velocity boundary conditions are set with respect to the predetermined model zone M in the vicinity of the roll gap 31a which is divided into finite elements by for example the partial model, with the two imaginary cutting planes 31A and 31B on either side of the model zone M as boundaries, and so as to satisfy the conditions where as if the overall shape of the rotary formed body 31 makes up an approximate toric plate shape for the reason that a continuous portion exists.

Moreover, in FIG. 3 and FIG. 4, the rotation direction of the rotary formed body 31 is a clockwise direction, and the imaginary cutting plane 31A is provided on the rotation direction side of the two sides of the model zone M, and the imaginary cutting plane 31B is provided on the opposite direction side to the rotation direction.

Then, for example in the case of deformation analysis, in the stiffness matrix K, zeros are set for the information of the zones that are not displaced. Accordingly, as in the matrix K $\alpha$ shown for example in FIG. 5A, the stiffness matrix K forms a distribution A of a diagonal zone having a predetermined width and non-zero elements concentrated near the main diagonal line, thus constructing a symmetrical band matrix.

Moreover, as mentioned below, in the stiffness matrix K to which the velocity boundary condition has been introduced, the velocity boundary condition is expressed by a linear combination of three variables, namely; an increasing rate $r_v$ of the radius of the rotary formed body 31, a correction value $c_v$ for the traverse velocity $o_v$ of the axis of rotation O of the rotary formed body 31, and an angular velocity $\omega$ for the rotation about the axis of rotation O of the rotary formed body 31.

That is, in the stiffness matrix K forming a coefficient matrix set with respect to each velocity component $v_1, \ldots, v_n$ constituting a velocity vector $[v]=v_1, \ldots, v_n$, a zero is set for the coefficient corresponding to each velocity component $v_1, \ldots v_n$, and the three variables of the increasing rate $r_v$ of the radius, the correction value $c_v$ for the traverse velocity $o_v$, and the angular velocity $\omega$ are added to the velocity vector [v], and the predetermined coefficient corresponding to these three variables is added to the stiffness matrix K.

Accordingly, in the matrix K $\beta$ shown in FIG. 5B for example, the stiffness matrix K is constructed with a zone of three columns corresponding to the three expanded variables, newly reserved in the last line of the matrix K $\alpha$ shown in FIG. 5A.

In this case, by utilizing for example the coefficient storage method of the skyline method, it is not necessary for example to expand the memory zone from the α shown in FIG. 5A to the β shown in FIG. 5B, it being acceptable to merely expand the memory zone of the expanded three column part.

Then, in step S03, the solution of the non-linear simultaneous equations is obtained using equation (1), by for example a direct iteration method. In this case, in the situation where for example degrees of freedom in the three directions are provided with respect to each nodal point of the total number of nodal points N, this becomes a non-linear simultaneous equation in 3N dimensions.

Next, in step S04, the unbalanced force is calculated. That is, in the linear equation for obtaining the velocity vector [v] shown in equation (1) above, since the stiffness matrix [K] and the force vector [F] are expressed by functions of the velocity vector [v], firstly the current value $[v_m]$ of the velocity vector [v] is calculated using the stiffness matrix [K $(v_{m-1})$] and the force vector [F($v_{m-1}$)] calibrated for the previous value $[v_{m-1}]$ of the velocity vector [v] in a series of processes.

Then, based on the current value $[v_m]$ of the calculated velocity vector [v], the current stiffness matrix [K $(v_m)$] and force vector [F($v_m$)] are calculated, and the difference between [K $(v_m)$]×$[v_m]$ and [F($v_m$)] is calculated as the unbalanced force.

Moreover, the method of solving the simultaneous equations is not limited to the direct iteration method above, and other methods such as for example the Newton-Raphson method may be used.

Then, in step S05 it is judged if the difference between [K $(v_m)$]×$[v_m]$ and [F $(v_m)$] has converged to be smaller than for example a predetermined threshold value, that is, it is judged if [K $(v_m)$]×$[v_m]$ and [F $(v_m)$] retain a balance related to the force.

In the case where the judgment result is 'NO', control proceeds to step S01. On the other hand, in the case where the judgment result is 'YES', control proceeds to step S07.

Then, in step S07, a time integration process is performed with respect to the calculated velocity field, the deformation and strain in the model zone M is calculated, and the velocity boundary condition is changed.

Here, for example when the deformed shape is calculated by the time integration process, then as mentioned below, this integration is performed using a cylindrical coordinate system centered on the axis of rotation O of the rotary formed body 31 at this time. Consequently, it is possible to avoid the accumulation of errors due to the integration calculation.

Moreover, in the numerical integration, considering the velocity component corresponding to rotation in the circumferential direction of the rotary formed body 31 becoming large, it is considered necessary to avoid that the partially modeled model zone M would be flowing out from within the roll gap 31a in only the peripheral direction (circumferential direction). Hence the integration is performed in the circumferential direction using the Euler method.

On the other hand, with respect to the cross-section shape of the rotary formed body 31 prescribed by the diametric direction (the radial direction) and the direction along the axis of rotation O, the integration is performed using Lagrange's method in order to accurately reproduce the change in shape of the cross-section form.

Then, in step S08, it is judged if a predetermined time in the series of processes has lapsed. In the case where the judgment result is 'NO', the processes subsequent to step S01 are repeated. On the other hand, in the case where the judgment result is 'YES', the series of processes is terminated.

Consequently, firstly, based on the velocity field calculated by the initial process, each finite element is virtually displaced towards the exit side, that is, the imaginary cutting plane 31A. By so doing, the data (for example, the information for the deformed shape and strain) that is set for the imaginary cutting plane 31A on the exit side before displacement, is output from the model zone M. On the other hand, in the imaginary cutting plane 31B on the entry side, new information that has not been set is entered into the model zone M before displacement.

That is to say, because the approximate toric plate rotary formed body 31 is formed while being rotated, it is necessary to re-enter data, such as the data that is output from the imaginary cutting plane 31A on the exit side in the circumferential direction, into the model zone M from the imaginary cutting plane 31B on the entry side.

Consequently, the non-model zone NM is divided by for example, the plurality of elements for data storage (Mesh), and the data output from the imaginary cutting plane 31A of the model zone M is stored sequentially in each element. Accordingly, the data output from the imaginary cutting plane 31A sequentially moves each element inside the non-model zone NM, and after moving all elements provided in a circumferential direction, is entered for a second time into the model zone M from the imaginary cutting plane 31B on the entry side.

Moreover, in the case where the data that is output from the model zone M is entered a second time into the model zone M, the method is not limited to that as mentioned above of providing the mesh for data storage in the non-model zone NM. For example in the case where there is a smooth change of deformed shape and strain in the non-model zone NM, then as shown for example in FIG. 6, the data entered into the model zone M may also be calculated using the predetermined function related to the angle θ about the axis of rotation O, for example interpolation by linear approximation, based on the data for the imaginary cutting plane 31A on the exit side and the imaginary cutting plane 31B on the entry side (for example, strains $\epsilon_a$, $\epsilon_b$ shown in FIG. 6).

Hereunder is an explanation of the process of introducing of boundary conditions in the above-mentioned step S02.

As shown in FIG. 3, since plastic deformation of the rotary formed body 31 is rendered in the roll gap 31a between the main roll 32 and the mandrel roll 33, then in the case where the deformation analysis is performed by numerical simulation, the partial model for analysis is performed by dividing only the vicinity of the roll gap 31a into finite elements.

Here, when time has lapsed from time $t=t_0$ to time $t'=t_0+\Delta t$, plastic deformation in the rotary formed body 31 is produced under the following three assumptions.

Firstly, for the first assumption, the rolling (elongation) corresponding to the circumferential direction of the rotary formed body 31 will be produced only in the inside of the model zone M in the vicinity of the roll gap 31a that is partially modeled.

In addition, for the second assumption, the non-model zone NM that has not been partially modeled, that is, the zone excluding the vicinity of the roll gap 31a, is continuously connected to the model zone M, and for the whole shape of the rotary formed body 31 the shape of an approximate toric plate is maintained.

Moreover, for the third assumption, the axis of rotation O of the rotary formed body 31 is positioned on a straight line connecting the axis of rotation P1 of the main roll 32 and the axis of rotation P2 of the mandrel roll 33.

Here, for example, in the ring rolling mill 30 according to the present embodiment, these three assumptions are reasonable assumptions because, with regards to the first assumption, for example the axial roll (not shown in the figure) between which the rotary formed body 31 is inserted in the direction along the axis of rotation O, does not perform significant shaping. Moreover, with regards to the second assumption, the approximate toric plate rotary formed body 31 is such that the form of the toric shape is substantially retained even when the diameter is successively enlarged. Furthermore, with regards to the third assumption, a pair of support rolls (not shown in the figure) abutted against the outer peripheral surface of the rotary formed body 31 for restricting the displacement of the rotary formed body 31 in a predetermined direction is provided.

Here, with respect to the radius $r_0$ of the circumference passing the center position of the thick section in the radial direction of the rotary formed body 31 in time t, the radius $r_0'$, after the deformation in the time $t'=t_0+\Delta t$ after the predetermined time lapse $\Delta t$, is expressed in the following equation (2), by the increasing rate $r_v$ of the radius.

$$r_0'=r_0+r_v\Delta t \quad (2)$$

Here, the elongation deformation in the circumferential direction of the rotary formed body 31 according to the first assumption is produced inside the model zone M. Moreover, the rotary formed body 31 according to the second assumption is such since the shape of an approximate toric plate is maintained, then even if the angle $\theta_z$ made by the model zone M about the axis of rotation O, that is the angle $\theta_z$ made by the imaginary cutting plane 31A on the exit side and the imaginary cutting plane 31B on the entry side with respect to the axis of rotation O, is changed to angle $\theta_z'$ in time $t'$ after the deformation, as shown in the following equation (3), the length of the circumference in the non-model zone NM of the rotary formed body 31 is not changed.

$$(2\pi-\theta_z)r_0=(2\pi-\theta_z')r_0' \quad (3)$$

Accordingly, the incremental angle $\Delta\theta_z$ of the angle $\theta_z$ made by the model zone M about the axis of rotation O, is expressed in the following equation (4).

$$\Delta\theta_z = \theta_z' - \theta_z = \frac{r_v\Delta t(2\pi - \theta_z)}{r_0 + r_v\Delta t} \quad (4)$$

In addition, if the elongation deformation in circumferential direction produced in the rotary formed body 31 is divided equally with respect to the imaginary cutting plane 31B on the entry side and the imaginary cutting plane 31A on the exit side, and the imaginary cutting plane 31B on the entry side and the imaginary cutting plane 31A on the exit side are rotated at the angular velocity ω about the axis of rotation O with respect to the circumferential direction of the rotary formed body 31, then the following equation (5) holds between the angles with respect to the predetermined reference plane Z (shown in FIG. 3 and FIG. 4) that includes the axis of rotation O of the rotary formed body 31, namely the angle $\theta_a$ of the imaginary cutting plane 31A on the exit side and the angle $\theta_b$ of the imaginary cutting plane 31B on the entry side at time t, and the angle $\theta_a'$ and the angle $\theta_b'$ at the time $t'$ after the deformation.

$$\left.\begin{array}{l}\theta_a' = \theta_a - \frac{\Delta\theta_z}{2} + \omega\Delta t \\ \theta_b' = \theta_b + \frac{\Delta\theta_z}{2} + \omega\Delta t\end{array}\right\} \quad (5)$$

Here, according to the third assumption, the axis of rotation O of the rotary formed body 31 is displaced on the straight line connecting each axis of rotation P1 and P2 of the main roll 32 and the mandrel roll 33. As a factor exerting influence on the displacement of this axis of rotation O, for example the following two factors are considered.

The first factor is a factor for displacing the axis of rotation O accompanying the increase of the radius of the rotary formed body 31, in a direction away from the main roll 32. The second factor is a factor for adjoining to the main roll 32 the circumference that passes through the center position corresponding to the thick section in the radial direction of the rotary formed body 31, by adjacently moving the mandrel roll 33 towards the main roll 32 for which the axis of rotation P1 is fixed.

Consequently, the traverse velocity $o_v$ of the axis of rotation O is expressed in the following equation (6) by the radial increasing rate $r_v$ corresponding to the first factor, and the correction value $c_v$ for the traverse velocity $o_v$ in a direction for where the axis of rotation O corresponding to the second factor approaches the main roll 32.

$$o_v=c_v-r_v \quad (6)$$

Moreover, as shown in FIG. 3, the traverse velocity $v_{p1}$ of the main roll 32 and the traverse velocity $v_{p2}$ of the mandrel roll 33 viewed from the circumference passing through the center position corresponding to the thick section in the radial direction of the rotary formed body 31, are expressed in the following equation (7) by means of the velocity for moving the mandrel roll 33 towards the main roll 32, that is, the reduction velocity $v_p$.

$$\left.\begin{array}{l}v_{p1} = c_v \\ v_{p2} = v_p - c_v\end{array}\right\} \quad (7)$$

Here, with respect to the radius $r_n$ corresponding to the axis of rotation O of the appropriate nodal points $P_n$ on the imaginary cutting planes 31A and 31B in time t, the radius $r_n'$ after the deformation in the time $t'=t+\Delta t$ after the predetermined time lapse $\Delta t$, is expressed in the following equation (8) by the increasing rate $r_v$ of the radius.

$$r_n'=r_n+r_v\Delta t \quad (8)$$

Furthermore, in the case where the arbitrary points ($x_a$, $y_a$) of the imaginary cutting plane 31A on the exit side and the arbitrary point ($x_b$, $y_b$) of the imaginary cutting plane 31B on the entry side, in the radial direction of the rotary formed body 31 at time t are moved to each point ($x_a'$, $y_a'$) and point ($x_b'$, $y_b'$) at time $t'$ after the deformation, each point displacement ($\Delta x_a$, $\Delta y_a$) and ($\Delta X_b$, $\Delta Y_b$) is expressed by the following equation (9).

$$\left.\begin{array}{l}\Delta x_a = x'_a - x_a = r'_n\cos\theta'_a - r_n\cos\theta_a \\ \Delta y_a = y'_a - y_a = r'_n\sin\theta'_a - r_n\sin\theta_a + \Delta t(c_v - r_v) \\ \Delta x_b = x'_b - x_b = r'_n\cos\theta'_b - r_n\cos\theta_b \\ \Delta y_b = y'_b - y_b = r'_n\sin\theta'_b - r_n\sin\theta_b + \Delta t(c_v - r_v)\end{array}\right\} \quad (9)$$

Each of these displacement points ($\Delta x_a$, $\Delta y_a$) and ($\Delta x_b$, $\Delta y_b$) are divided by the predetermined time lapse $\Delta t$, and by making this time lapse $\Delta t$ close to zero, the velocity of each nodal point ($u_a$, $v_a$) and ($u_b$, $v_b$) is calculated, as shown in the following equation (10).

$$\left.\begin{array}{l}u_a = \lim_{\Delta t \to 0}\dfrac{\Delta x_a}{\Delta t} = \left(\cos\theta_a + r_n\dfrac{2\pi - \theta_z}{2r_0}\sin\theta_a\right)r_v - r_n\sin\theta_a\omega \\ v_a = \lim_{\Delta t \to 0}\dfrac{\Delta y_a}{\Delta t} = \left(\sin\theta_a - r_n\dfrac{2\pi - \theta_z}{2r_0}\cos\theta_a - 1\right)r_v + r_n\cos\theta_a\omega + c_v \\ u_b = \lim_{\Delta t \to 0}\dfrac{\Delta x_b}{\Delta t} = \left(\cos\theta_b - r_n\dfrac{2\pi - \theta_z}{2r_0}\sin\theta_b\right)r_v - r_n\sin\theta_b\omega \\ v_b = \lim_{\Delta t \to 0}\dfrac{\Delta y_b}{\Delta t} = \left(\sin\theta_b + r_n\dfrac{2\pi - \theta_z}{2r_0}\cos\theta_b - 1\right)r_v + r_n\sin\theta_b\omega + c_v\end{array}\right\} \quad (10)$$

Accordingly, it is possible to express the velocity of each nodal point ($u_a$, $v_a$) and ($u_b$, $v_b$) on the imaginary cutting planes 31A and 31B of the model zone M, that is, the velocity boundary conditions, by a linear combination of coefficients comprising the radius $r_n$ of the imaginary cutting planes 31A and 31B, and the angles $\theta_a$ and $\theta_b$ made by the imaginary cutting planes 31A and 31B, with respect to the three variables comprising the increasing rate $r_v$ of the radius of the rotary formed body 31, the angular velocity $\omega$ for the rotation about the axis of rotation O of the rotary formed body 31, and the correction value $c_v$ for the traverse velocity $o_v$ of the axis of rotation O of the rotary formed body 31. Moreover, $\theta_z = \theta_b - \theta_a$.

Next is an explanation with reference to FIG. 4, of the process for time integration in step S07 mentioned above, in particular the time integration corresponding to the position in the radial direction of the rotary formed body 31.

Here, in the case where the time integration of the coordinates in the radial direction is performed with respect to the appropriate nodal point $Q_o$, the nodal point adjacent to the nodal point $Q_o$ in the opposite direction of the rotating direction of the rotary formed body 31 is made nodal point $Q_p$.

Then, with respect to the predetermined time integration $\Delta t$, the point $Q_\theta$ for reaching the position of the nodal point $Q_o$ after the time lapse of this time integration $\Delta t$ is positioned between the nodal point $Q_o$ and the nodal point $Q_p$. The angle $\theta$ made with respect to the reference plane Z about the axis of rotation O of this point $Q_\theta$ becomes the value between the angle $\theta_o$ that the nodal point $Q_o$ makes with respect to the reference plane Z and the angle $\theta_p$ that the nodal point $Q_p$ makes with respect to reference plane Z.

Here, the angular velocity $\omega$ at the point $Q_\theta$ is expressed in the following equation (11), by the angular velocity $\omega_o$ of the nodal point $\omega_p$ the angular velocity $\omega_p$ of the nodal point $Q_p$, the velocity $dr_o/dt$ in the radial direction of the nodal point $Q_o$, and the velocity $dr_p/dt$ in the radial of the nodal point $Q_p$.

$$\omega = \omega_p + \dfrac{\omega_0 - \omega_p}{\theta_0 - \theta_p}(\theta - \theta_p) \quad (11)$$

Then, since the point $Q_\theta$ having this angular velocity $\omega$ reaches the nodal point $Q_o$ after the predetermined time integration $\Delta t$, the following equation (12) holds.

$$\theta + \omega\Delta t = \theta_0 \quad (12)$$

Consequently, from equation (11) and equation (12), the following equation (13) holds.

$$\theta = \theta_0 - \dfrac{\omega_0\Delta t(\theta_0 - \theta_p)}{(\theta_0 - \theta_p) + \Delta t(\omega_0 - \omega_p)} \quad (13)$$

By means of this angle $\theta$, the position r in the radial direction and the velocity $dr/dt$ in the radial direction at the position of the point $Q_\theta$ is expressed by the following equation (14).

$$\left.\begin{array}{l}r = r_p + \dfrac{r_0 - r_p}{\theta_0 - \theta_p}(\theta - \theta_p) \\ \dfrac{dr}{dt} = \dot{r} = \dot{r}_p + \dfrac{\dot{r}_0 - \dot{r}_p}{\theta_0 - \theta_p}(\theta - \theta_p)\end{array}\right\} \quad (14)$$

Further, the velocity $dr_o/dt$ in the radial direction of the nodal point $Q_o$ and the velocity $dr_p/dt$ in the radial direction of the nodal point $Q_p$ are made the following equations (15).

$$\left.\begin{array}{l}\dfrac{dr_p}{dt} = \dot{r}_p \\ \dfrac{dr_0}{dt} = \dot{r}_0\end{array}\right\} \quad (15)$$

Accordingly, the position $r_o'$ in the radial direction after the predetermined time integration $\Delta t$ with respect to the nodal point $Q_o$ which becomes the object of the time integration, is expressed by the following equation (16).

$$r_o' = r + \dot{r}\Delta t \quad (16)$$

As mentioned above, according to the numerical-simulation method for rotary metal forming of the present embodiment, the rotary formed body 31 is considered in order to retain the form of an approximate toric shape. By considering the behavior of the rotary formed body 31 as a whole, highly accurate numerical simulation of the ring rolling is possible.

Moreover, for example compared to the method for modeling and analyzing the entire rotary formed body 31, the accuracy of the numerical simulation does not deteriorate, and it is possible to considerably reduce the computation time necessary.

Accordingly, it is possible to contribute to an improvement in efficiency of the process design of the ring rolling process, and to decrease the trial frequency in the actual ring rolling, and stability in the quality of the products made by ring rolling can be improved.

Moreover, in the present embodiment as mentioned above, the velocity ($u_a$, $v_a$) and ($u_b$, $v_b$) of each nodal point on the imaginary cutting planes 31A and 31B of the model zone M, that is, the velocity boundary condition, is expressed by the linear combination of the three variables comprising; the increasing rate $r_v$ of the radius of the rotary formed body 31, the angular velocity $\omega$ of the rotary formed body 31, and the correction value $c_v$ for the traverse velocity $o_v$ of the axis of rotation 0 of the rotary formed body 31. However it is not limited to this, and as in a numerical-simulation method for rotary metal forming according to a first modified example of the present embodiment, for example, in place of the increasing rate $r_v$ of the radius, as shown in the following equation (17), the increasing rate ($d\theta_z/dt$) of the angle corresponding to the circumferential direction of the model zone M may be made a variable, and the increasing rate ($d\theta_z/dt$) of this angle can be converted from the increasing rate $r_v$ of the radius.

$$\frac{d\theta_z}{dt} = \dot{\theta}_z = \lim_{\Delta t \to 0} \frac{\Delta \theta_z}{\Delta t} = \lim_{\Delta t \to 0} \frac{r_v(2\pi - \theta_z)}{r_0 + r_v \Delta t} = \frac{r_v(2\pi - \theta_z)}{r_0} \quad (17)$$

Accordingly it is possible to express the velocity boundary conditions by the following equation (18).

$$\left.\begin{aligned} u_a &= \left(r_0 \frac{\cos\theta_a}{2\pi - \theta_z} + \frac{r_n}{2}\sin\theta_a\right)\dot{\theta}_z - r_n \sin\theta_a \omega \\ v_a &= \left(r_0 \frac{\sin\theta_a - 1}{2\pi - \theta_z} - \frac{r_n}{2}\cos\theta_a\right)\dot{\theta}_z + r_n \cos\theta_a \omega + c_v \\ u_b &= \left(r_0 \frac{\cos\theta_b}{2\pi - \theta_z} - \frac{r_n}{2}\sin\theta_b\right)\dot{\theta}_z - r_n \sin\theta_b \omega \\ v_b &= \left(r_0 \frac{\sin\theta_b - 1}{2\pi - \theta_z} + \frac{r_n}{2}\cos\theta_b\right)\dot{\theta}_z + r_n \sin\theta_b \omega + c_v \end{aligned}\right\} \quad (18)$$

Moreover, as in a numerical-simulation method for rotary metal forming according to a second modified example of the present embodiment, for example in place of the increasing rate $r_v$ of the radius and the angular velocity $\omega$ in the circumferential direction of the rotary formed body 31, as shown in the following equation (19), the angular velocity ($d\theta_a/dt$) and ($d\theta_b/dt$) of the imaginary cutting planes 31A and 31B may be made variables.

Here, these angular velocities ($d\theta_a/dt$) and ($d\theta_b/dt$) as shown in the equation (17) and the following equation (20), may be converted from the increasing rate $r_v$ of the radius and the angular velocity $\omega$.

$$\left.\begin{aligned} \frac{d\theta_a}{dt} &= \dot{\theta}_a = \lim_{\Delta t \to 0} \frac{\theta'_a - \theta_a}{\Delta t} = \omega - \frac{\dot{\theta}_z}{2} \\ \frac{d\theta_b}{dt} &= \dot{\theta}_b = \lim_{\Delta t \to 0} \frac{\theta'_b - \theta_b}{\Delta t} = \omega + \frac{\dot{\theta}_z}{2} \end{aligned}\right\} \quad (19)$$

$$\omega = \frac{\dot{\theta}_a + \dot{\theta}_b}{2} \quad (20)$$

$$\dot{\theta}_z = \dot{\theta}_b - \dot{\theta}_a$$

Consequently it is possible to represent the velocity boundary conditions by the following equations (21).

$$\left.\begin{aligned} u_a &= \left(-r_0 \frac{\cos\theta_a}{2\pi - \theta_z} - r_n \sin\theta_a\right)\dot{\theta}_a + r_0 \frac{\cos\theta_a}{2\pi - \theta_z}\dot{\theta}_b \\ v_a &= \left(-r_0 \frac{\sin\theta_a - 1}{2\pi - \theta_z} + r_n \cos\theta_a\right)\dot{\theta}_a + r_0 \frac{\sin\theta_a - 1}{2\pi - \theta_z}\dot{\theta}_b + c_v \\ u_b &= -r_0 \frac{\cos\theta_b}{2\pi - \theta_z}\dot{\theta}_a + \left(r_0 \frac{\cos\theta_b}{2\pi - \theta_z} - r_n \sin\theta_b\right)\dot{\theta}_b \\ v_b &= -r_0 \frac{\sin\theta_b - 1}{2\pi - \theta_z}\dot{\theta}_a + \left(r_0 \frac{\sin\theta_b - 1}{2\pi - \theta_z} + r_n \cos\theta_b\right)\dot{\theta}_b + c_v \end{aligned}\right\} \quad (21)$$

As mentioned above, according to the numerical-simulation method for rotary metal forming according to the first modified example and the second modified example of the present embodiment, it is possible to express the velocity boundary conditions by converting the angular velocity $\omega$ of the rotary formed body 31, the correction value $c_v$ for the traverse velocity $o_v$ of the axis of rotation O, and the increasing rate $r_v$ of the radius of the rotary formed body 31 into other variables. Hence it is possible to increase the degree of freedom of the numerical simulation and improve the generality of the numerical simulation.

However, for example as in the numerical-simulation method according to the partial model related to one example of the related art mentioned above (D. Y. Yang, K. H. KIM and J. B. Hawkyard, Simulation of T-section Profile Ring Rolling by the 3-D Rigid-Plastic Finite Element Method. Int. J. Mech. Sci. 33, 541 (1991)), by expressing the velocity boundary condition in the following equation (22), there is the case where it is not possible to reproduce the plastic deformation where the rotary formed body 31 elongates in the circumferential direction. On the other hand, using the proposed method, the shape change and strain of the rotary formed body 31 can be calculated with high accuracy.

$$\left.\begin{aligned} u_a &= -r_n \sin\theta_a \dot{\theta}_a \\ v_a &= r_n \cos\theta_a \dot{\theta}_a \\ u_b &= -r_n \sin\theta_b \dot{\theta}_b \\ v_b &= r_n \cos\theta_b \dot{\theta}_b \end{aligned}\right\} \quad (22)$$

Next, is an explanation with reference to FIG. 7A through FIG. 9C of the results for where the ring rolling process is analyzed by numerical simulation using the numerical-simulation method for rotary metal forming according to the above-mentioned present embodiment.

Figure 7A:
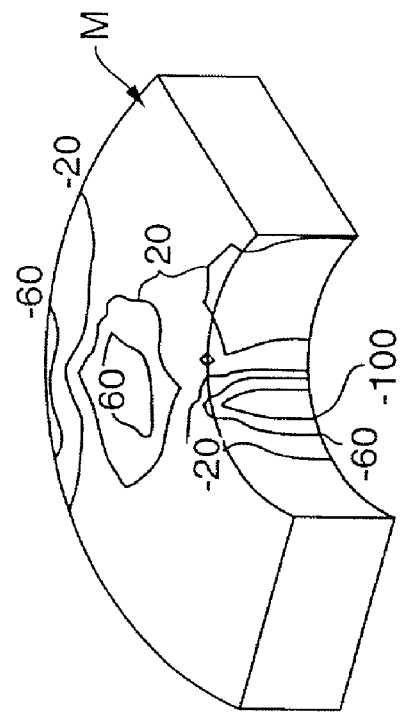
FIG. 7A is a diagram showing calculation results of stress distribution in the radial direction in the case where a reduction in the radial direction of the rotary formed body is 0%, being a diagram showing the results for an example according to a partial model of the rotary formed body.
Figure 7C:
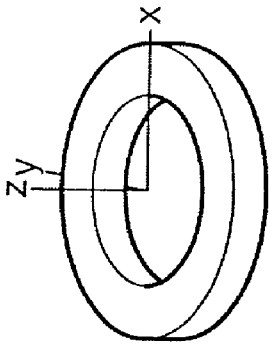
FIG. 7C is a diagram showing a coordinate system employed in FIGS. 7A and 7B.
Figure 7B:
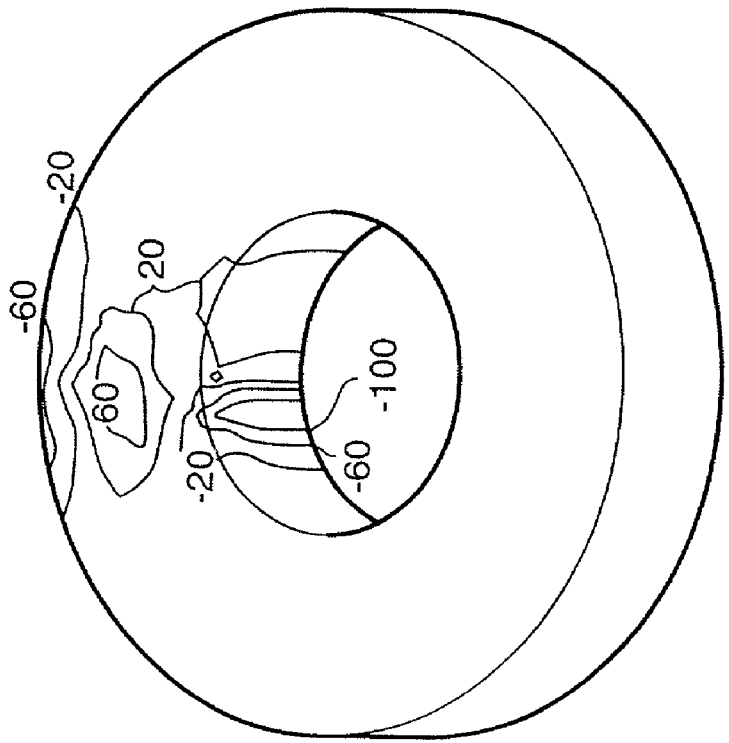
FIG. 7B is a diagram showing calculation results of stress distribution in the radial direction in the case where a reduction in the radial direction of the rotary formed body is 0%, being a diagram showing the results for a comparative example where the entire rotary formed body is modeled and analyzed.
Figure 9A:
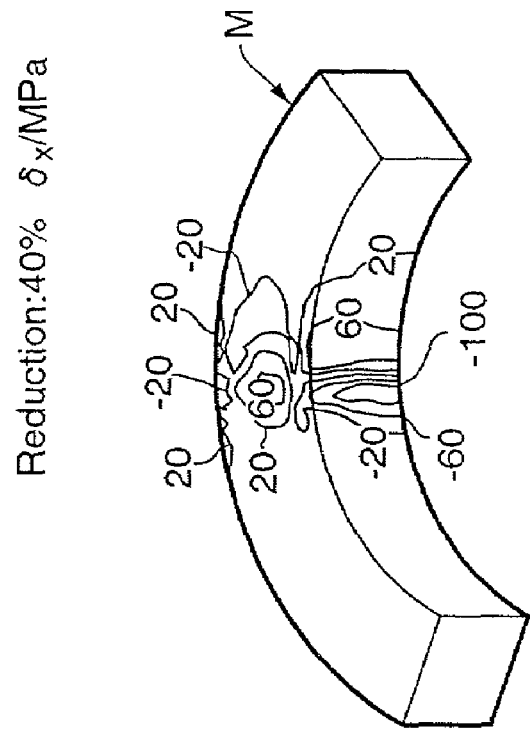
FIG. 9A is a diagram showing the calculation results of the stress distribution in the case where the reduction in the radial direction of the rotary formed body 31 is 40%, being a diagram showing the result for an example according to the partial model of the rotary formed body 31.
Figure 9B:
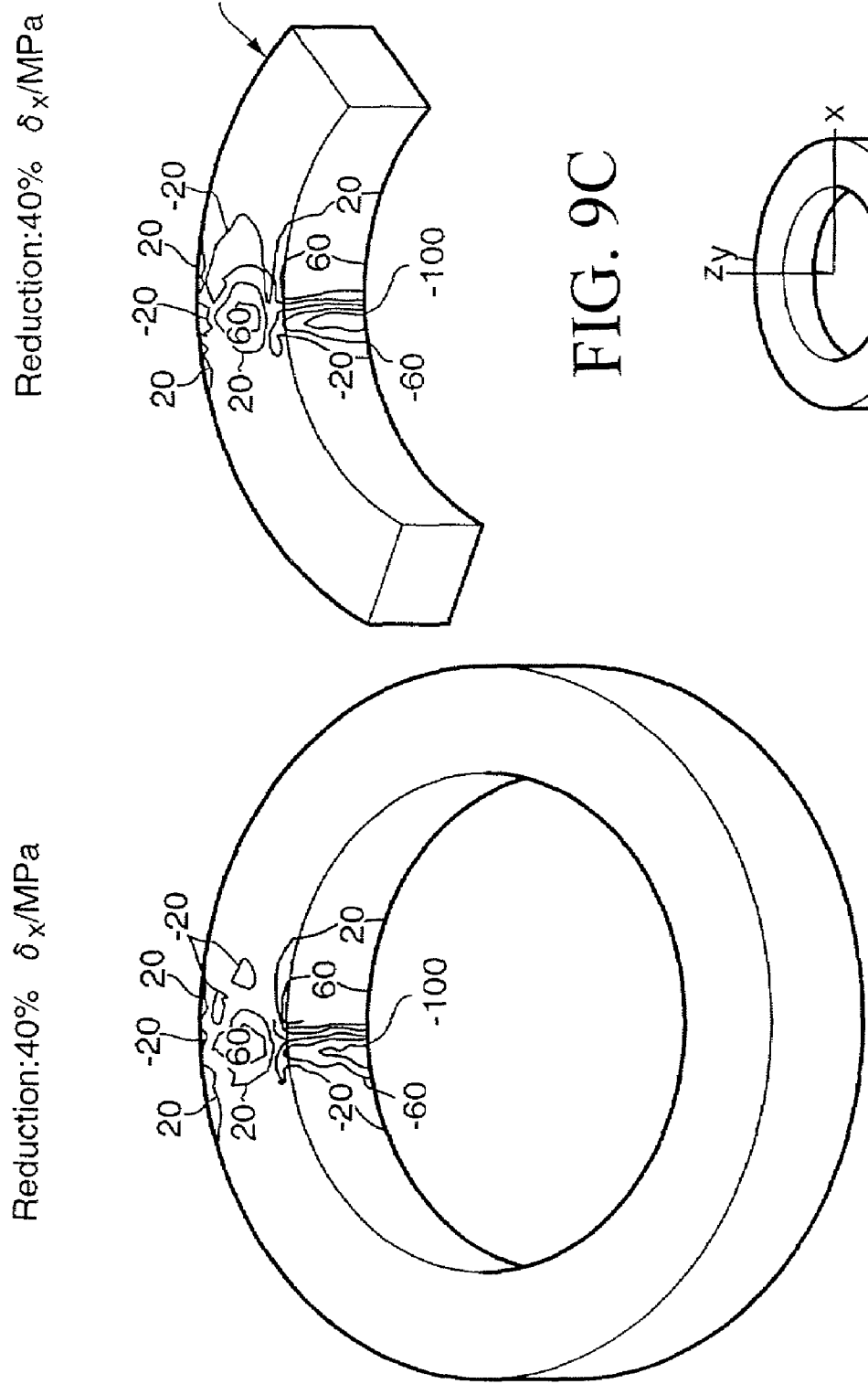
FIG. 9B is a diagram showing the calculation results of the stress distribution in the case where the reduction in the radial direction of the rotary formed body 31 is 40%, being a diagram showing the results for a comparative example where the entire rotary formed body 31 is modeled and analyzed.
Figure 9C:
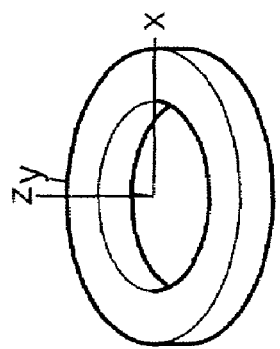
FIG. 9C is a diagram showing a coordinate system employed in FIGS. 9A and 9B.

FIG. 7A to FIG. 7C are figures showing the calculation results of the stress distribution in the radial direction in the case where the reduction in the radial direction of the rotary formed body 31 is 0%. FIG. 7A is a figure showing the results for the embodiment according to the partial model of the rotary formed body 31. FIG. 7B is a figure showing the result for a comparative example where the entire rotary formed body 31 is modeled and analyzed. FIG. 8A to FIG. 8C are figures showing the calculation results of the stress distribution in the case where the reduction in the radial direction of the rotary formed body 31 is 15%. FIG. 8A is a figure showing the results for the embodiment according to the partial model of the rotary formed body 31. FIG. 8B is a figure showing the results for a comparative example where the entire rotary formed body 31 is modeled and analyzed. FIG. 9A to 9C are figures showing the calculation results of the stress distribution in the case where the reduction in the radial direction of the rotary formed body 31 is 40%. FIG. 9A is a figure showing the results for the embodiment according to the partial model of the rotary formed body 31. FIG. 9B is a figure showing the results for a comparative example where the entire rotary formed body 31 is modeled and analyzed.

Here, as a comparative example for the results where the entire toric plate shaped rotary formed body 31 is modeled and numerical simulation performed, the results for where numerical simulation is performed using the partial model according to the numerical-simulation method for rotary metal forming according to the present embodiment is made an example.

Here, in the example and the comparative example, numerical simulation was executed with respect to the case where the toric plate shaped rotary formed body 31 composed of a material with a constant deformation resistance at 100 MPa, was rolled out by ring rolling.

As shown in FIG. 7A through FIG. 9C, the stress distribution in the radial direction of the rotary formed body 31 is not related to the reduction, but shows a distribution almost the same for the example and the comparative example. Hence it can be concluded that even with a method using the partial model, it is possible to perform numerical simulation to a high accuracy commensurable with the entire model.

However, if the computation time taken for the comparative example using the whole model is 1, the computation time taken for the example using the partial model is 0.088. Hence the necessary computation time can be significantly reduced.

Moreover, in the above mentioned present embodiment, the numerical simulation is performed with respect to the ring rolling process. However it is not limited to this, and it is also possible to apply the present invention to transient deformation where the axis of rotation of the rotary formed body is not displaced, as in, for example disk rolling, cylindrical and conical spinning, disk edge curling and rotary forging. In this case, after the introduction of the boundary conditions, a zero may be set for the correction value $c_v$ for the increasing rate $r_v$ of the radius of the rotary formed body 31 and the traverse velocity $o_v$ of the axis of rotation O of the rotary formed body 31, and/or for the other variables capable of conversion into the increasing rate $r_v$ and the correction value $c_v$. Consequently, as with the ring rolling, numerical simulation of rotary metal forming can be performed with high accuracy and high speed.

Furthermore, in the present embodiment mentioned above, the explanation has been given of the process for time integration of the deformation velocity related to the coordinates of the nodal points. However, it is not limited to this, and it is possible to apply a similar integration method also with respect to obtaining other variables that are time integrated, such as strain by time integrating strain rate.

In addition, it is also possible to perform temperature coupled analysis by inputting data for temperature dependence as a deformation resistance.

Furthermore, the simulation apparatus 10 for realizing the numerical-simulation method for rotary working according to the first embodiment of the present invention may be realized according to specialized hardware. Moreover, this may be made constituted by a memory and CPU (Central Processing Unit), and a program for realizing the function of the simulation apparatus 10 then loaded into the memory and executed to thereby realize the function.

Moreover, the numerical simulation for rotary metal forming may be performed by recording on a computer readable recording medium, a program for realizing the above mentioned numerical-simulation method for rotary metal forming according to the present invention, and then reading the program recorded on this recording medium into a computer system and executing. Further, the computer system mentioned here may include an OS (Operating System) and hardware such as peripheral devices.

In addition, a computer readable recording medium refers to a portable medium such as a flexible disk, a magneto-optical disk, a ROM (Read Only Memory), a CD (Compact Disk)—ROM, or a storage device such as a hard disk incorporated into the computer system. Furthermore, a computer readable storage medium also includes a medium which dynamically retains a program during a short time such as with a communication line in the case where a program is transmitted via a network such as the Internet or via a communication line such as a telephone line, and a medium which retains a program for a fixed time such as with a volatile memory inside a computer system which constitutes a server or a client for that case.

Moreover, the above mentioned program may be one for realizing a part of the above mentioned functions. Furthermore, this may be one which can be realized in combination with a program where the aforementioned functions are already recorded on a computer system.

The invention claimed is:

1. A computer-implemented numerical-simulation method for rotary metal forming, comprising:
   dividing, into a plurality of finite elements, a predetermined model zone between two imaginary cutting planes intersecting with a circumferential direction in a rotary formed body rotated about an axis of rotation;
   setting velocity boundary conditions of said imaginary cutting planes for said predetermined model zone by a function, wherein an angular velocity for rotation about said axis of rotation of said rotary formed body is variable and the velocity boundary conditions are set so as to model plastic deformation of said rotary formed body in the circumferential direction; and
   analyzing, by a finite element method, a forming process that continuously produces plastic deformation by localized contact with said rotary formed body,
   wherein in a case where said axis of rotation is displaced with an addition of an increase in diameter of said rotary formed body in said forming process, said velocity boundary conditions are set equal to a function having three variables, including (1) a rate of increase of the diameter of said rotary formed body, (2) said angular velocity for rotation about said axis of rotation of said rotary formed body, and (3) a correction value for traverse velocity of said axis of rotation.

2. The numerical-simulation method for rotary metal forming according to claim 1, wherein said velocity boundary conditions are set in terms of a rate of increase of an angular extent of the model zone.

3. The numerical-simulation method for rotary metal forming according to claim 1, further comprising:
   applying an Euler method wherein said finite elements are spatially fixed with respect to the rotation direction of said rotary formed body; and
   applying a Lagrange method wherein said finite elements are movable with said rotary formed body with respect to a direction along said axis of rotation of said rotary formed body and the radial direction of said rotary formed body.

4. The numerical-simulation method for rotary metal forming according to claim 3, further comprising:

dividing a non-model zone outside of said model zone of said rotary formed body by elements for data storage, and of said two imaginary culling planes, sequentially storing data related to said velocity boundary conditions output from one of said imaginary culling planes in said elements for data storage, and inpulling from an other of said imaginary culling planes.

5. The numerical simulation method of claim 3, further comprising:
computing data for a non-model zone outside of said model zone of said rotary formed body using interpolation related to the angle about said axis of rotation, based on data at one of said imaginary cutting planes and data at another of said imaginary cutting planes, and inputting from said another of said imaginary cutting planes.

6. The numerical-simulation method for rotary metal forming according to claim 1, further comprising:
dividing a non-model zone outside of said model zone of said rotary formed body by elements for data storage, and of said two imaginary cutting planes, sequentially storing data related to said velocity boundary conditions output from one of said imaginary cutting planes in said elements for data storage, and inputting from an other of said imaginary cutting planes.

7. The numerical-simulation method for rotary metal forming according to claim 1, wherein the method is used for process design of a metal working process that reduces necessary computation time without degrading the accuracy of the numerical simulation,
the predetermined model zone is a subject of said numerical simulation,
said velocity boundary conditions are a velocity of nodal points on the imaginary cutting planes; and
the method further comprises outputting a calculation result of stress distribution of said rotary formed body.

8. The numerical simulation method of claim 1, further comprising:
computing data for a non-model zone outside of said model zone of said rotary formed body using interpolation related to the angle about said axis of rotation, based on data at one of said imaginary cutting planes and data at another of said imaginary cutting planes, and inputting from said another of said imaginary cutting planes.

9. A computer-readable recording medium recorded with a computer program for making a computer function as a fixed axis of rotation time conversion section by performing the steps of:
dividing, into a plurality of finite elements, a predetermined model zone between two imaginary cutting planes intersecting with a circumferential direction in a rotary formed body rotated about an axis of rotation;
setting velocity boundary conditions of said imaginary cutting planes for said predetermined model zone by a function, wherein an angular velocity for rotation about said axis of rotation of said rotary formed body is variable and the velocity boundary conditions are set so as to model plastic deformation of said rotary formed body in the circumferential direction; and
analyzing, by a finite element method, a forming process that continuously produces plastic deformation by localized contact with said rotary formed body,
the recording medium further comprising a program for making said computer function as a boundary condition conversion section for, in a case where said axis of rotation is displaced with an addition of an increase in diameter of said rotary formed body in said forming process, setting said velocity boundary conditions equal to a function having three variables, including (1) a rate of increase of the diameter of said rotary formed body, (2) said angular velocity for rotation about said axis of rotation of said rotary formed body, and (3) a correction value for traverse velocity of said axis of rotation.

10. A recording medium according to claim 9, recorded with a program for making said computer function as a variable conversion section for setting said velocity boundary conditions in terms of a rate of increase of an angular extent of the model zone.

11. A recording medium according to claim 9, further comprising a program for making said computer function as an integrating section by performing the steps of:
applying an Euler method wherein said finite elements are spatially fixed with respect to the rotation direction of said rotary formed body; and
applying a Lagrange method wherein said finite elements are movable with said rotary formed body, with respect to a direction along said axis of rotation of said rotary formed body and the radial direction of said rotary formed body.

12. A recording medium according to claim 11, further comprising a program for making said computer function as a data setting section by:
dividing a non-model zone outside of said model zone of said rotary formed body by elements for data storage, and of said two imaginary culling planes, sequentially storing data related to said velocity boundary conditions output from one of said imaginary culling planes in said elements for data storage, and inpulling from an other of said imaginary culling planes.

13. The recording medium of claim 11, wherein the program further comprises:
computing data for a non-model zone outside of said model zone of said rotary formed body using interpolation related to the angle about said axis of rotation, based on data at one of said imaginary cutting planes and data at another of said imaginary cutting planes, and inputting from said another of said imaginary cutting planes.

14. A recording medium according to claim 9, further comprising a program for making said computer function as a data setting section by:
dividing a non-model zone outside of said model zone of said rotary formed body by elements for data storage, and of said two imaginary cutting planes, sequentially storing data related to said velocity boundary conditions output from one of said imaginary cutting planes in said elements for data storage, and inputting from an other of said imaginary cutting planes.

15. The recording medium of claim 9, wherein the program further comprises:
computing data for a non-model zone outside of said model zone of said rotary formed body using interpolation related to the angle about said axis of rotation, based on data at one of said imaginary cutting planes and data at another of said imaginary cutting planes, and inputting from said another of said imaginary cutting planes.

16. A system for numerical-simulation of rotary metal forming, comprising:
a first device configured to divide, into a plurality of finite elements, a predetermined model zone between two imaginary cutting planes intersecting with a circumferential direction in a rotary formed body rotated about an axis of rotation;

a second device configured to set velocity boundary conditions of said imaginary cutting planes for said predetermined model zone by a function, wherein an angular velocity for rotation about said axis of rotation of said rotary formed body is variable and the velocity boundary conditions are set so as to model plastic deformation of said rotary formed body in the circumferential direction; and a third device configured to analyze, by a finite element method, a forming process that continuously produces plastic deformation by localized contact with said rotary formed body, wherein in a case where said axis of rotation is displaced with an addition of an increase in diameter of said rotary formed body in said forming process, said second device is configured to set said velocity boundary conditions equal to a function having three variables, including (1) a rate of increase of the diameter of said rotary formed body, (2) said angular velocity for rotation about said axis of rotation of said rotary formed body, and (3) a correction value for traverse velocity of said axis of rotation.

* * * * *